United States Patent
Saito et al.

(10) Patent No.: US 8,987,712 B2
(45) Date of Patent: Mar. 24, 2015

(54) DISPLAY DEVICE

(71) Applicants: Nobuyoshi Saito, Tokyo (JP); Kentaro Miura, Kanagawa-ken (JP); Tomomasa Ueda, Kanagawa-ken (JP); Shintaro Nakano, Kanagawa-ken (JP); Tatsunori Sakano, Tokyo (JP); Hajime Yamaguchi, Kanagawa-ken (JP)

(72) Inventors: Nobuyoshi Saito, Tokyo (JP); Kentaro Miura, Kanagawa-ken (JP); Tomomasa Ueda, Kanagawa-ken (JP); Shintaro Nakano, Kanagawa-ken (JP); Tatsunori Sakano, Tokyo (JP); Hajime Yamaguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 17 days.

(21) Appl. No.: 13/622,558

(22) Filed: Sep. 19, 2012

(65) Prior Publication Data

US 2013/0277667 A1 Oct. 24, 2013

(30) Foreign Application Priority Data

Apr. 19, 2012 (JP) ................................ 2012-095913

(51) Int. Cl.
*H01L 29/08* (2006.01)
*H01L 51/52* (2006.01)
*H01L 27/32* (2006.01)

(52) U.S. Cl.
CPC ......... *H01L 51/5231* (2013.01); *H01L 27/3262* (2013.01); *H01L 51/5259* (2013.01); *H01L 51/5284* (2013.01)
USPC ........... 257/40; 257/43; 257/59; 257/E27.119

(58) Field of Classification Search
CPC ............ H01L 27/3262; H01L 51/5284; H01L 51/5259
USPC ................................ 257/40, 59, E27.119, 43
See application file for complete search history.

(56) References Cited

U.S. PATENT DOCUMENTS

| | | | |
|---|---|---|---|
| 7,811,679 B2 | 10/2010 | Aziz et al. | |
| 2006/0087230 A1 | 4/2006 | Ghosh et al. | |
| 2006/0263593 A1 | 11/2006 | Aziz et al. | |
| 2008/0043329 A1* | 2/2008 | Jagt et al. | 359/494 |

(Continued)

FOREIGN PATENT DOCUMENTS

| | | |
|---|---|---|
| JP | 08-008065 A | 1/1996 |
| JP | 10-255986 A | 9/1998 |

(Continued)

OTHER PUBLICATIONS

Korean Office Action issued Nov. 27, 2013, in Korea Patent Application No. 10-2012-0105690 (with English translation).

(Continued)

*Primary Examiner* — Long K Tran
(74) *Attorney, Agent, or Firm* — Oblon, McClelland, Maier & Neustadt, L.L.P.

(57) ABSTRACT

According to one embodiment, a display device includes a light transmissive substrate, a light transmissive pixel electrode, a switching element, an organic light emitting layer, a light transmissive opposite electrode, a conductive light absorption layer and a conductive film. The light transmissive pixel electrode is provided on the substrate. The switching element is provided on the substrate and electrically connected to the pixel electrode. The organic light emitting layer is provided on the pixel electrode. The light transmissive opposite electrode is provided on the organic light emitting layer. The conductive light absorption layer is provided on the opposite electrode. The conductive film is provided on the light absorption layer.

18 Claims, 3 Drawing Sheets

(56) References Cited

U.S. PATENT DOCUMENTS

| | | | |
|---|---|---|---|
| 2008/0239189 A1* | 10/2008 | Hatta et al. | 349/46 |
| 2008/0277666 A1* | 11/2008 | Jeon et al. | 257/66 |
| 2009/0039353 A1* | 2/2009 | Jun et al. | 257/72 |
| 2011/0032223 A1* | 2/2011 | Okamoto et al. | 345/204 |
| 2011/0039353 A1* | 2/2011 | Des Rosiers et al. | 436/501 |

FOREIGN PATENT DOCUMENTS

| | | |
|---|---|---|
| JP | 2002-33185 | 1/2002 |
| JP | 2004-303481 A | 10/2004 |
| JP | 2005-309400 A | 11/2005 |
| JP | 2007-169304 A | 7/2007 |
| JP | 2008-518399 | 5/2008 |
| JP | 2011-14550 | 1/2011 |
| KR | 10-2006-0001377 | 1/2006 |
| KR | 10-2006-0120502 | 11/2006 |

OTHER PUBLICATIONS

Office Action issued May 9, 2014 in Korean Patent Application No. 10-2012-105690 (with English translation).

Office Action issued Jul. 7, 2014 in Japanese Patent Application No. 2012-095913 (with English language translation).

Korean Office Action issued Jul. 2, 2014 in Patent Application No. 10-2012-0105690 with English Translation.

* cited by examiner

DISPLAY DEVICE

CROSS-REFERENCE TO RELATED APPLICATIONS

This application is based upon and claims the benefit of priority from the prior Japanese Patent Application No. 2012-095913, filed on Apr. 19, 2012; the entire contents of which are incorporated herein by reference.

FIELD

Embodiments described herein relate generally to a display device.

BACKGROUND

There is an active matrix display device in which a switching element such as a thin film transistor controls a current passing through an organic EL (Electro-Luminescent) device. It is desired to improve image quality in this display device.

DETAILED DESCRIPTION

Figure 1:
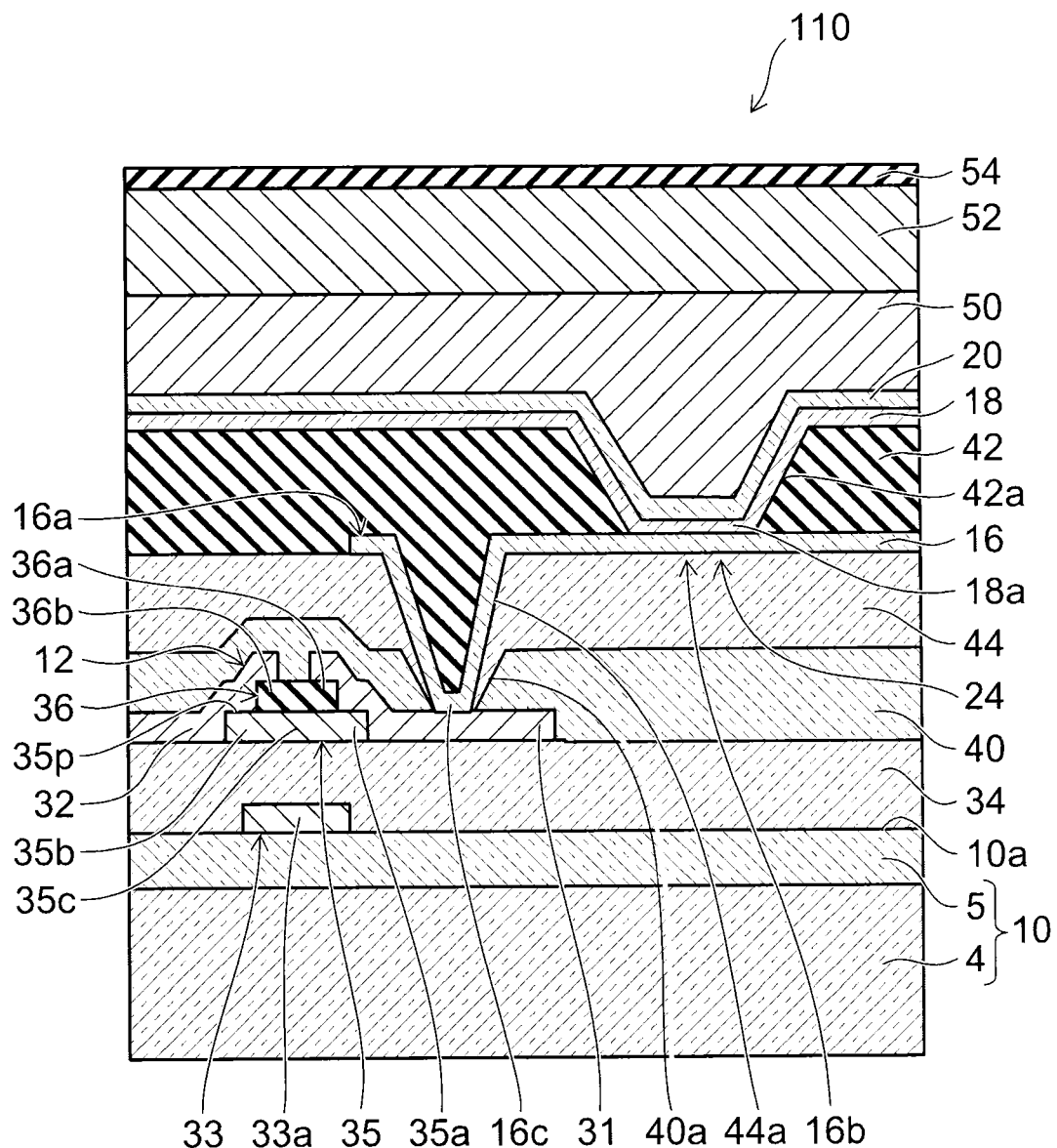
FIG. 1 is a schematic cross-sectional view illustrating the configuration of a display device according to a first embodiment.

According to one embodiment, a display device includes a substrate, a pixel electrode, a switching element, an organic light emitting layer, an opposite electrode, a light absorption layer and a conductive film. The substrate is light transmissive. The pixel electrode is provided on the substrate. The pixel electrode is light transmissive. The switching element is provided on the substrate and electrically connected to the pixel electrode. The organic light emitting layer is provided on the pixel electrode. The opposite electrode is provided on the organic light emitting layer. The opposite electrode is light transmissive. The light absorption layer is provided on the opposite electrode. The light absorption layer is conductive. The conductive film is provided on the light absorption layer.

Various embodiments will be described hereinafter with reference to the accompanying drawings.

It is noted that the drawings are schematic or conceptual. The relationship between the thicknesses and widths of portions, a ratio of size between portions, or the like are not necessarily the same as real ones. Moreover, even in the case of expressing the same portions, dimensions and ratios between the portions are sometimes expressed differently depending on the drawings.

In the specification and drawings, components similar to those described or illustrated in a drawing thereinabove are marked with the identical reference numerals, and a detailed description is omitted as appropriate.

First Embodiment

FIG. 1 is a schematic cross-sectional view illustrating the configuration of a display device according to a first embodiment.

As shown in FIG. 1, a display device 110 according to the embodiment includes a substrate 10, a switching element 12, a pixel electrode 16, an organic light emitting layer 18, a cathode 20 (opposite electrode), a light absorption layer 50, and a conductive film 52.

The pixel electrode 16, the organic light emitting layer 18, and the cathode 20 form an organic EL light emitting element portion 24. The light emitting element portion 24 is controlled and driven by the switching element 12. In the display device 110, the combinations of the switching elements 12 and the light emitting element portions 24 are disposed in a matrix configuration. The drive of the switching elements 12 and the light emission of the light emitting element portions 24 are controlled to display pictures. The display device 110 is an active matrix display device using an organic EL device.

The substrate 10 has a major surface 10a. The substrate 10 is light transmissive, for example. The substrate 10 is transparent, for example. The substrate 10 has birefringence, for example. The birefringence of the substrate 10 has a retardation of 10 nm or more in plane and in a film thickness direction, for example. The substrate 10 includes a main body portion 4 and a barrier layer 5. The main body portion 4 is light transmissive, for example. The main body portion 4 further has flexibility, for example. A resin material such as a polyimide resin and an aramid resin is used for the main body portion 4, for example. The barrier layer 5 suppresses the penetration of impurities and moisture, for example. The barrier layer 5 protects the switching element 12 and the light emitting element portion 24, for example, provided on the substrate 10. A material being light transmissive and flexible, for example, is used for the barrier layer 5. A silicon oxide film, a silicon nitride film, or the like, for example, is used for the barrier layer 5. A stacked body of a silicon oxide film and a silicon nitride film or the like may be used for the barrier layer 5, for example. A material with no flexibility such as a glass material and a resin material, for example, may be used for the main body portion 4.

The switching element 12 is provided on the major surface 10a of the substrate 10.

The switching element 12 includes a first conducting portion 31, a second conducting portion 32, a gate electrode 33, a gate insulating film 34, a semiconductor film 35, and a channel protection film 36.

The gate electrode 33 is provided on the major surface 10a of the substrate 10. A high melting point metal such as molybdenum tungsten (MoW), molybdenum tantalum (MoTa), and tungsten (W), for example, is used for the gate electrode 33. An Al alloy having a principal component of Al in which an anti-hillock configuration is provided may be used for the gate electrode 33, for example. A stacked body of Al and a high melting point metal may be used for the gate electrode 33, for example.

The gate insulating film 34 is provided on the gate electrode 33. In this example, the gate insulating film 34 is provided on throughout the major surface 10a so as to cover the gate electrode 33. A material being insulative and light transmissive is used for the gate insulating film 34, for example. A silicon oxide film, a silicon nitride film, a silicon oxynitride film, or the like can be used for the gate insulating film 34, for example. A stacked body including at least one of a silicon oxide film, a silicon nitride film, and a silicon oxynitride film may be used for the gate insulating film 34, for example.

The semiconductor film 35 is provided on the gate insulating film 34. The gate insulating film 34 is provided between the gate electrode 33 and the semiconductor film 35, and insulates the gate electrode 33 from the semiconductor film 35. An amorphous oxide semiconductor containing at least one of In, Ga, and Zn is used for the semiconductor film 35, for example. Namely, one of an In—Ga—Zn—O oxide semiconductor, an In—Ga—O oxide semiconductor, and an In—Zn—O oxide semiconductor is used for the semiconductor film 35, for example. The thickness of the semiconductor film 35 (a distance along a Z-axis direction) is about 10 nm, for example. Thereby, the electric characteristics of the semiconductor film 35 are made excellent. More specifically, the thickness of the semiconductor film 35 is 10 nm or more and 100 nm or less, for example. The semiconductor film 35 may be an oxide semiconductor having other compositions, polysilicon, microcrystal silicon, amorphous silicon, an organic semiconductor, or the like, for example.

In the semiconductor film 35 including an amorphous oxide semiconductor, a diffraction pattern or the like showing crystallinity is not observed even though the semiconductor film 35 is observed using a transmission electron microscope (TEM) or X-ray diffraction (XRD) topography, for example. The film and shape of the semiconductor film 35 can be observed using a scanning electron microscope (SEM), TEM, or the like. For the semiconductor film 35, such a material may be used that the microcrystals of the oxide semiconductor are dispersed in the amorphous oxide semiconductor described above.

The first conducting portion 31 is electrically connected to the semiconductor film 35. The second conducting portion 32 is provided apart from the first conducting portion 31, and electrically connected to the semiconductor film 35. Ti, Al, Mo, or the like, for example, is used for the first conducting portion 31 and the second conducting portion 32. The first conducting portion 31 and the second conducting portion 32 may be a stacked body containing at least one of Ti, Al, and Mo, for example. The first conducting portion 31 is one of the source electrode and drain electrode of the switching element 12. The second conducting portion 32 is the other of the source electrode and drain electrode of the switching element 12.

The channel protection film 36 is provided on the semiconductor film 35. The channel protection film 36 protects the semiconductor film 35. An insulating material is used for the channel protection film 36. A silicon oxide film, for example, is used for the channel protection film 36. In the case where an amorphous oxide semiconductor is used for the semiconductor film 35, a silicon oxide film with acid resistance higher than the acid resistance of the semiconductor film 35 is used for the channel protection film 36, for example. The channel protection film 36 may be a silicon nitride film or a silicon oxynitride film, for example.

The first conducting portion 31 covers a first portion 36a of the channel protection film 36. The second conducting portion 32 covers a second portion 36b of the channel protection film 36. The first conducting portion 31 covers a first region 35a of the semiconductor film 35. The second conducting portion 32 covers a second region 35b of the semiconductor film 35. The semiconductor film 35 has a third region 35c that is not covered with the first conducting portion 31 and the second conducting portion 32. The gate electrode 33 has a portion 33a between the first conducting portion 31 and the second conducting portion 32 when seen in a direction vertical to a film surface 35p of the semiconductor film 35 (in the following, referred to as the Z-axis direction). Namely, the gate electrode 33 opposes the third region 35c of the semiconductor film 35 as sandwiching the gate insulating film 34 therebetween. The channel protection film 36 is provided at least on the third region 35c.

A voltage is applied to the gate electrode 33 to generate a channel through the semiconductor film 35, and a current is passed across the first conducting portion 31 and the second conducting portion 32. In this example, the switching element 12 is a bottom gate thin film transistor. The switching element 12 is not limited to a bottom gate thin film transistor, which may be a transistor in other structures or the like.

A passivation film 40 is provided between the switching element 12 and the pixel electrode 16. A material being insulative and light transmissive is used for the passivation film 40, for example. The passivation film 40 is transparent, for example. A silicon oxide film, a silicon nitride film, a silicon oxynitride film, aluminum oxide ($Al_2O_3$), or the like is used for the passivation film 40, for example.

In this example, a color filter 44 is provided between the pixel electrode 16 and the passivation film 40. The color filter 44 has a different color for every pixel. One of red, green and blue color resin films (a color resist, for example) is used for the color filter 44, for example. The color filter 44 is light transmissive. The transmittance of the color filter 44 is varied depending on wavelengths, for example. The color filter 44 is provided as necessary. The color filter 44 can be omitted.

The pixel electrode 16 is electrically connected to one of the first conducting portion 31 and the second conducting portion 32. In this example, the pixel electrode 16 is electrically connected to the first conducting portion 31 (a source, for example). The pixel electrode 16 is provided on the major surface 10a. In this example, the pixel electrode 16 is provided on the color filter 44. The pixel electrode 16 has an opposing region 16a opposing the switching element 12 and a non-opposing region 16b not opposing the switching element 12 in the Z-axis direction. A material being electrically conductive and light transmissive is used for the pixel electrode 16, for example. ITO (Indium Tin Oxide), an ITO/Ag/ITO stacked structure, AZO that is ZnO doped with Al, or the like is used for the pixel electrode 16, for example.

The passivation film 40 and the color filter 44 are provided with an opening 40a and an opening 44a, respectively, from which a part of the first conducting portion 31 is exposed. A part 16c of the opposing region 16a of the pixel electrode 16 contacts the first conducting portion 31 in the opening 40a and the opening 44a. Thereby, the pixel electrode 16 is electrically connected to the first conducting portion 31.

A planarization film 42 is provided on the pixel electrode 16 and the color filter 44. A material being insulative and light transmissive is used for the planarization film 42, for example. The planarization film 42 is transparent, for example. An organic resin material is used for the planarization film 42, for example. A photosensitive acrylic resin, a photosensitive polyimide, or the like is used for the planarization film 42, for example. The planarization film 42 has an opening 42a from which a part of the non-opposing region 16b of the pixel electrode 16 is exposed.

The organic light emitting layer 18 is provided on the planarization film 42. A part 18a of the organic light emitting layer 18 enters the opening 42a. The organic light emitting layer 18 contacts the non-opposing region 16b of the pixel electrode 16 in the opening 42a. The organic light emitting layer 18 is electrically connected to the pixel electrode 16 in the opening 42a, for example. The planarization film 42 prevents the opposing region 16a from contacting the organic light emitting layer 18. A stacked body having a hole transport layer, a light emitting layer, and an electron transport layer stacked on each other is used for the organic light emitting layer 18, for example. The organic light emitting layer 18 is light transmissive. The organic light emitting layer 18 is transparent, for example.

The cathode 20 is provided on the organic light emitting layer 18. A material being electrically conductive and light transmissive is used for the cathode 20. The cathode 20 is transparent, for example. A metal film is used for the cathode 20, for example. MgAg is used for the cathode 20, for example. The thickness of the cathode 20 is 5 nm or more and 20 nm or less, for example. The specific resistance of the cathode 20 is 1 μΩcm or more and 10 μΩcm or less, for example. In this example, the pixel electrode 16 is served as an anode, and the opposite electrode is served as a cathode. In the embodiment, the pixel electrode 16 may be served as a cathode, and the opposite electrode may be served as an anode.

For example, the light emitting element portion 24 is formed in the non-opposing region 16b. In the light emitting element portion 24, a voltage is applied to the pixel electrode 16 and the cathode 20 to emit light from the organic light emitting layer 18. The light emitted from the organic light emitting layer 18 passes through the color filter 44, the passivation film 40, the gate insulating film 34, and the substrate 10, and goes to the outside. The display device 110 is a lower surface emitting display device.

The light absorption layer 50 is provided on the cathode 20. The light absorption of the light absorption layer 50 is higher than the light absorption of the cathode 20, for example. The absorption coefficient of the light absorption layer 50 is higher than the absorption coefficient of the cathode 20, for example. The reflectance of the light absorption layer 50 is smaller than the reflectance of the cathode 20, for example. The optical density (OD) of the light absorption layer 50 is 2 or more. The light absorption layer 50 has electrical conductivity. The specific resistance of the light absorption layer 50 is $1\times10^2$ μΩcm or more and $1\times10^4$ μΩcm or less, for example. The resistance of the light absorption layer 50 is higher than the resistance of the cathode 20, for example. The light absorption layer 50 contacts the cathode 20, for example. The light absorption layer 50 is electrically connected to the cathode 20. The light absorption layer 50 contains carbon black, for example. A resin having carbon black and metal particles dispersed is used for the light absorption layer 50, for example.

The conductive film 52 is provided on the light absorption layer 50. The conductive film 52 contacts the light absorption layer 50, for example. The conductive film 52 is electrically connected to the light absorption layer 50. Namely, in the display device 110, the potential of the cathode 20, the potential of the light absorption layer 50, and the potential of the conductive film 52 are substantially the same. The specific resistance of the conductive film 52 is 10 μΩcm or less, for example, and more specifically, 1 μΩcm or more and 5 μΩcm or less, for example. The resistance of the conductive film 52 is lower than the resistance of the light absorption layer 50, for example. The resistance of the conductive film 52 is lower than the resistance of the cathode 20, for example. A metal film is used for the conductive film 52, for example. Al is used for the conductive film 52, for example.

The light absorption of the light absorption layer 50 is higher than the light absorption of the conductive film 52, for example. The absorption coefficient of the light absorption layer 50 is higher than the absorption coefficient of the conductive film 52, for example. The reflectance of the light absorption layer 50 is smaller than the reflectance of the conductive film 52, for example.

A sealing film 54 is provided on the conductive film 52, for example. The sealing film 54 suppresses the penetration of impurities, moisture, or the like, for example. The sealing film 54 protects the switching element 12, the light emitting element portion 24, or the like from moisture or the like, for example. An insulating material is used for the sealing film 54. A silicon oxide film, a silicon oxynitride film, a silicon nitride film, alumina, a tantalum oxide film, or the like is used for the sealing film 54, for example.

In the organic EL display device, there is a configuration in which a metal material such as Al is used for the cathode 20. This configuration has a problem in that external light incident from the substrate 10 side reflects at the cathode 20 to reduce the contrast of a picture to be displayed. In the organic EL display device, for example, there is also a configuration in which a circular polarization film is provided on the opposite surface of the substrate to the major surface 10a or the like and a polarization phenomenon is used to suppress the reflection of external light. However, in the configuration in which the circular polarization film is provided, it is difficult to appropriately suppress the reflection of external light in the case of using a material with a large birefringence such as a polyimide resin and an aramid resin for the substrate 10. For example, in the case where the birefringence of the substrate 10 is large, such an angle occurs that it is difficult to block incoming external light and external light that reflects at the cathode 20 even though the circular polarization film is provided. Thus, a reduction in the contrast caused by external light occurs depending on an angle at which the display device is seen, and the image quality of the display device deteriorates.

A polyimide resin has high heating resistance. In the case of using a polyimide resin for the substrate 10, a heat treatment at a high temperature similar to a temperature in a heat treatment of a glass substrate is made possible. Moreover, since a polyimide resin also has flexibility, the polyimide resin is useful for a material to form a flexible display device. Thereby, in the organic EL display device, it is desired to appropriately suppress the reflection of external light also in the case of using a material with a high birefringence for the substrate 10.

In the display device 110 according to the embodiment, incident external light passes through the substrate 10, the gate insulating film 34, the passivation film 40, the color filter 44, the pixel electrode 16, the planarization film 42, the organic light emitting layer 18, and the cathode 20, for example, and is absorbed in the light absorption layer 50. Thereby, in the display device 110, the reflection of external light can be suppressed. For example, the image quality of the display device 110 is improved. Moreover, the configuration of the display device 110 does not depend on the birefringence of the substrate 10. Therefore, in the display device 110, also in the case of using a material with a high birefringence for the substrate 10, the reflection of external light can be appropriately suppressed. In the display device 110, for example, materials usable for the substrate 10 can be increased.

In order to appropriately emit light from the organic light emitting layer 18, it is necessary to form the cathode 20 including MgAg or the like between the organic light emitting layer 18 and the light absorption layer 50. When the thickness of the cathode 20 is too thick, transmittance is reduced to cause external light to reflect at the cathode 20. Moreover, when the thickness of the cathode 20 is too thin, the resistance of the cathode 20 is increased. When the resistance of the cathode 20 is high, luminous efficiency is reduced, for example. For example, power consumption is increased.

Therefore, in the display device 110, the thickness of the cathode 20 is 5 nm or more and 20 nm or less, for example. Thereby, appropriate transparency is obtained in the cathode 20. In the display device 110, the light absorption layer 50 has electrical conductivity, and the conductive film 52 is provided on the light absorption layer 50. The resistance of the conductive film 52 is lower than the resistance of the cathode 20 and the resistance of the light absorption layer 50, for example. Thereby, in the display device 110, for example, when light is emitted from the organic light emitting layer 18, a current is provided to the conductive film 52 through the pixel electrode 16, the organic light emitting layer 18, the cathode 20, and the light absorption layer 50. Therefore, in the display device 110, also in the case where the thickness of the cathode 20 is reduced, it is possible to obtain appropriate electric characteristics. For example, it is possible to suppress a reduction in luminous efficiency and an increase in power consumption.

Second Embodiment

Figure 2:
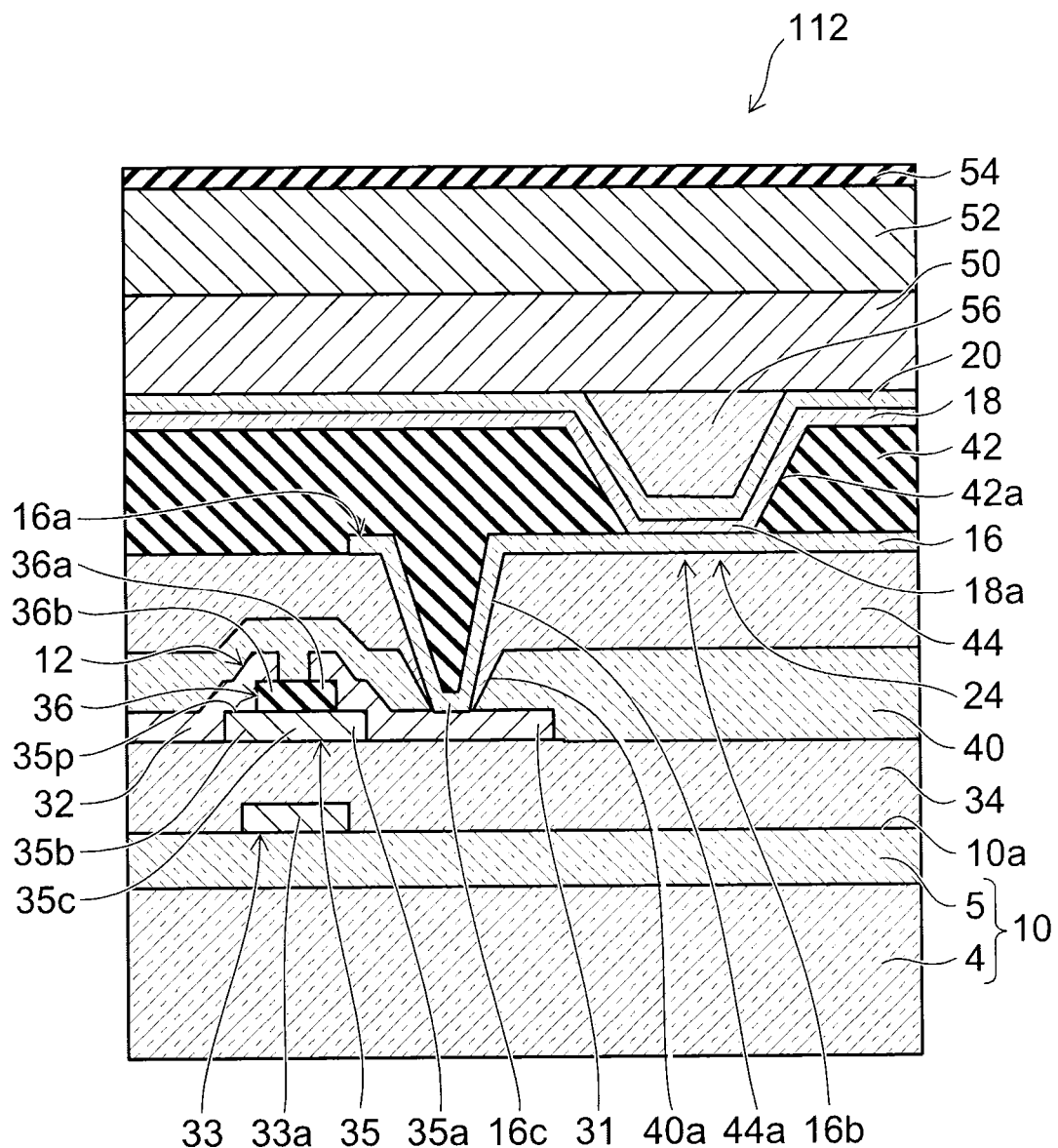
FIG. 2 is a schematic cross-sectional view illustrating the configuration of a display device according to a second embodiment.

FIG. 2 is a schematic cross-sectional view illustrating the configuration of a display device according to a second embodiment.

As shown in FIG. 2, a display device 112 according to the embodiment further includes a drying agent layer 56.

The drying agent layer 56 is provided between a cathode 20 and a light absorption layer 50, for example. The drying agent layer 56 is provided between a part 18a of an organic light emitting layer 18 entering an opening 42a and the light absorption layer 50, for example. The drying agent layer 56 is formed so as to fill the opening 42a, for example. The drying agent layer 56 is light transmissive, for example. The drying agent layer 56 is transparent, for example.

The drying agent layer 56 has properties to absorb hydrogen and oxygen, for example. The drying agent layer 56 contains at least one element of an alkali metal and an alkali earth metal, for example. More specifically, the drying agent layer 56 contains at least one element of lithium, sodium, magnesium, potassium, calcium, rubidium, cesium, strontium, and barium. The drying agent layer 56 is formed in which at least one element of the elements recited above is dispersed in a resin material such as an acrylic or an epoxy, for example.

In the configuration of the display device 110, for example, moisture, oxygen, or the like included in the light absorption layer 50 sometimes adversely affects the organic light emitting layer 18. The drying agent layer 56 is provided between the cathode 20 and the light absorption layer 50 to protect the organic light emitting layer 18 from moisture, oxygen, or the like included in the light absorption layer 50. Thereby, the drying agent layer 56 improves the reliability of the display device 112, for example. For example, the reliability of the display device 112 is higher than the reliability of the display device 110.

FIG. 3A to FIG. 3G are schematic cross-sectional views illustrating a manufacturing method for the display device according to the second embodiment.

As shown in FIG. 3, in the manufacture of the display device 112, for example, a liquid of a polyimide resin is applied on a glass plate, not shown, in a thickness of 10 μm for baking to form a main body portion 4. A barrier layer 5 is formed on the main body portion 4. Thus, a substrate 10 having flexibility is formed. A silicon nitride film or a silicon oxide film is used for the barrier layer 5, for example.

A switching element 12 is formed on a major surface 10a of the substrate 10. In forming the switching element 12, a gate electrode 33 is formed on the major surface 10a. The gate electrode 33 is formed by forming a MoW layer by sputtering and patterning using photolithography, for example. The thickness of MoW layer is 200 nm (100 nm or more 300 nm or less), for example. A gate insulating film 34 is formed on the major surface 10a and the gate electrode 33. The gate insulating film 34 is formed by forming a silicon oxide film by PE-CVD (Plasma-Enhanced Chemical Vapor Deposition), for example. The thickness of the silicon oxide film is 300 nm (200 nm or more 400 nm or less), for example. A semiconductor film 35 is formed on the gate insulating film 34. The semiconductor film 35 is formed by forming a-InGaZnO in a thickness of 50 nm (10 nm or more and 100 nm or less) by sputtering and patterning, for example. A channel protection film 36 is formed on the semiconductor film 35. A first conducting portion 31 and a second conducting portion 32 are formed on the gate insulating film 34, the semiconductor film 35, and the channel protection film 36. The first conducting portion 31 and the second conducting portion 32 are formed by forming a Mo/Al/Mo stacked film by sputtering, for example.

Figure 3A:
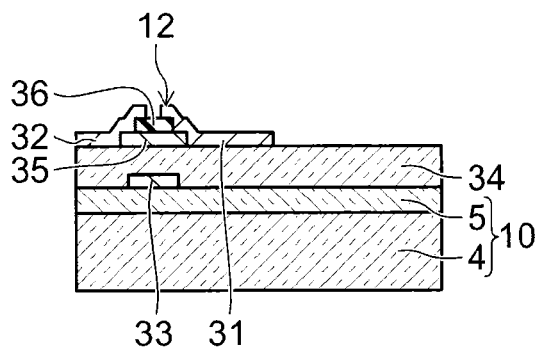
FIG. 3A to FIG. 3G are schematic cross-sectional views illustrating a manufacturing method for the display device according to the second embodiment.
Figure 3B:
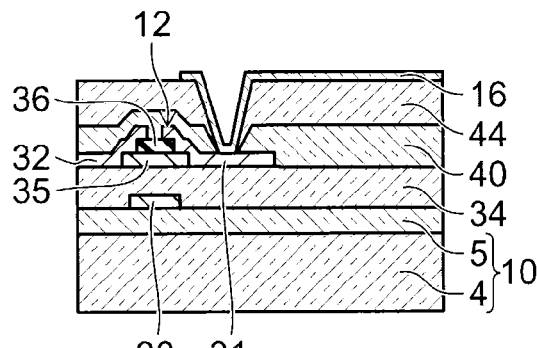

As shown in FIG. 3B, a passivation film 40 is formed on the switching element 12, and then an opening 40a is formed. For example, a silicon oxide film to be the passivation film 40 is formed by PE-CVD. The thickness of the passivation film is 200 nm (100 nm or more 300 nm or less), for example.

A color filter 44 is formed on the passivation film 40, and then an opening 44a is formed. The color filter 44 is formed by forming color resin films (a color resist, for example) of red, green or blue are formed and patterning the color resin films, for example. The thickness of the color filter 44 is 2 μm (1 μm or more 3 μm or less, for example), for example.

A pixel electrode 16 is formed on the color filter 44. For example, an ITO film to be the pixel electrode 16 is formed by sputtering or the like, and processed in a predetermined shape, and then the pixel electrode 16 is obtained. The thickness of the pixel electrode 16 is 60 nm (30 nm or more and 200 nm or less), for example.

Figure 3C:
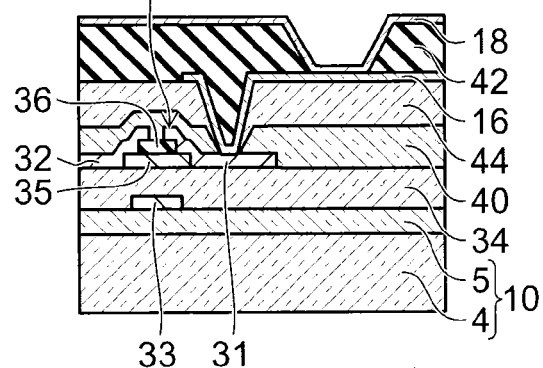

As shown in FIG. 3C, a planarization film 42 is formed on the pixel electrode 16 and the color filter 44, and then the opening 42a is formed. For example, a photosensitive acrylic resin to be the planarization film 42 is applied and patterned, and then the planarization film 42 is obtained. The organic light emitting layer 18 is formed on the planarization film 42 and a non-opposing region 16b of the pixel electrode 16. The organic light emitting layer 18 is formed by vapor deposition, for example.

Figure 3D:
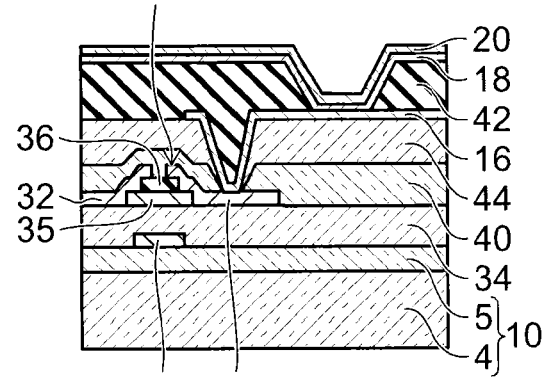

As shown in FIG. 3D, the cathode 20 is formed on the organic light emitting layer 18. For example, an MgAg film to be the cathode 20 is formed by sputtering or the like, and patterned in a predetermined shape, and then the cathode 20 is obtained. The thickness of the cathode 20 is 10 nm (5 nm or more and 20 nm or less), for example.

Figure 3E:
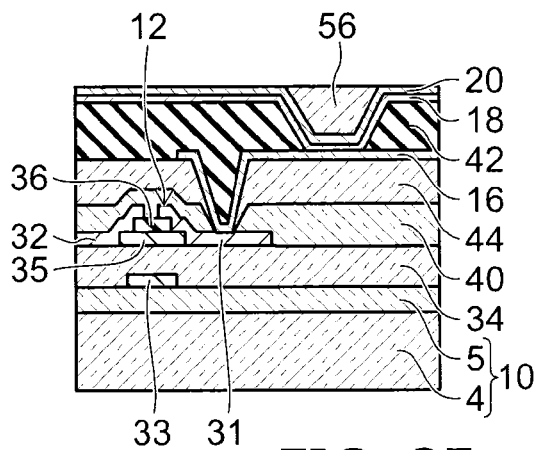

As shown in FIG. 3E, the dryin agent layer 56 is formed in the opening 42a of the planarization film 42. For example, a resin containing at least one element of an alkali metal and an alkali earth metal is applied on a part of the opening 42a by ink jet and cured, and then the drying agent layer 56 is obtained.

Figure 3F:
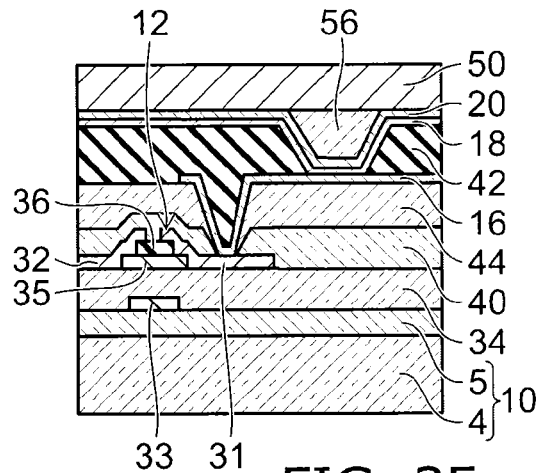

As shown in FIG. 3F, the light absorption layer 50 is formed on the cathode 20 and the drying agent layer 56. For example, a liquid of a resin containing carbon black being solved in a solvent is applied on the entire surfaces of the cathode 20 and the drying agent layer 56. Heat treatment is performed to evaporate the solvent for curing the resin. Thus, the light absorption layer 50 is formed.

Figure 3G:
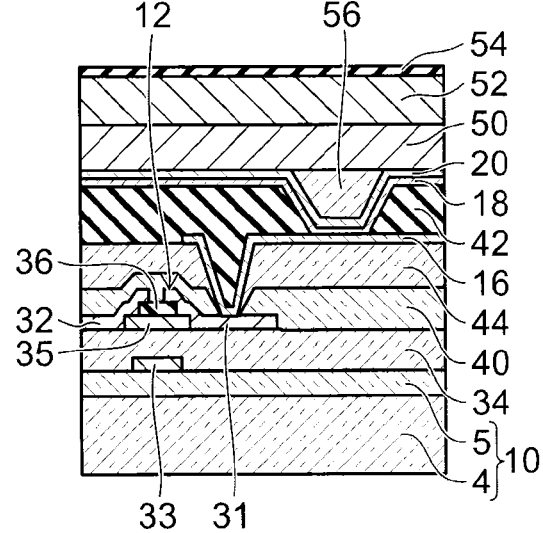

As shown in FIG. 3G, a conductive film 52 is formed on the light absorption layer 50. For example, an Al film to be the conductive film 52 is formed by vapor deposition or the like, and then the conductive film 52 is obtained. The thickness of the conductive film 52 is 150 nm (50 nm or more 300 nm or less), for example. A sealing film 54 is formed on the conductive film 52. For example, a silicon nitride film to be the sealing film 54 is formed by PE-CVD or the like, and then the sealing film 54 is obtained.

As described above, the display device 112 is fabricated.

In the case of manufacturing the display device 110, forming the drying agent layer 56 is omitted and the light absorption layer 50 is formed on the cathode 20 in the description recited above.

According to the embodiment, it is possible to provide a display device with high image quality.

In the specification of the application, "vertical" and "parallel" refer to not only strictly vertical and strictly parallel but also include, for example, the fluctuation due to manufacturing processes, etc. It is sufficient to be substantially vertical and substantially parallel.

In the specification of the application, a state in which "a component is provided on another component" includes a state in which a component is directly provided on another component as well as a state in which a component is provided on another component with a different element being inserted between the component and another component. A state in which "a component is stacked on another component" includes a state in which a component is stacked on another component to contact each other as well as a state in which a component is stacked on another component with a different element being inserted between the component and another component. A state in which "a component opposes another component" includes a state in which a component directly faces another component as well as a state in which a component faces another component with a different element being inserted between the component and another component.

As described above, the embodiments of the invention are described with reference to specific examples.

However, the embodiments of the invention are not limited to these specific examples. For example, the specific configurations of the components such as the substrate, the pixel electrode, the switching element, the organic light emitting layer, the cathode, the light absorption layer, the conductive film, the drying agent layer, and the planarization film included in the display device are incorporated in the scope of the invention as long as a person skilled in the art appropriately selects components from the publicly known range to similarly implement the invention for obtaining the similar effect.

Further, any two or more components of the specific examples may be combined within the extent of technical feasibility and are included in the scope of the invention to the extent that the purport of the invention is included.

Moreover, all display devices practicable by an appropriate design modification by a person skilled in the art based on the display devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A display device comprising:
   a light transmissive substrate;
   a pixel electrode provided on the substrate, the pixel electrode being light transmissive;
   a switching element provided on the substrate and electrically connected to the pixel electrode;
   an organic light emitting layer provided on the pixel electrode;
   an opposite electrode provided on the organic light emitting layer, the opposite electrode being light transmissive;
   a light absorption layer provided on the opposite electrode, the light absorption layer being conductive;
   a conductive film provided on the light absorption layer;
   an insulating planarization film provided between the pixel electrode and the organic light emitting layer, the planarization film having an opening, a part of the pixel electrode being exposed from the opening, a part of the organic light emitting layer and a part of the opposite electrode entering the opening, and
   a drying agent layer provided between the part of the opposite electrode and the light absorption layer, the drying agent layer being light transmissive.

2. The device according to claim 1, wherein a light absorption of the light absorption layer is higher than a light absorption of the opposite electrode.

3. The device according to claim 1, wherein a resistance of the conductive film is lower than a resistance of the light absorption layer.

4. The device according to claim 1, wherein the light absorption layer comprises a carbon black.

5. The device according to claim 1, wherein a specific resistance of the light absorption layer is $1\times10^4$ μΩcm or less.

6. The device according to claim 5, wherein a specific resistance of the light absorption layer is $1\times10^2$ μΩcm or more.

7. The device according to claim 1, wherein a specific resistance of the conductive film is 10 μΩcm or less.

8. The device according to claim 1, wherein the substrate has birefringence.

9. The device according to claim 8, wherein the substrate further has flexibility.

10. The device according to claim 9, wherein the substrate comprises at least one of a polyimide resin and an aramid resin.

11. The device according to claim 1, wherein the drying agent layer comprises at least one element of lithium, sodium, magnesium, potassium, calcium, rubidium, cesium, strontium, and barium.

12. The device according to claim 1, wherein the pixel electrode comprises one of ITO, an ITO/Ag/ITO stacked structure, and ZnO containing Al.

13. The device according to claim 1, wherein the opposite electrode comprises MgAg.

14. The device according to claim 13, wherein a thickness of the opposite electrode is 5 nm or more and 20 nm or less.

15. The device according to claim 1, wherein the switching element comprises:
   a gate electrode provided on the substrate,
   a gate insulating film provided on the gate electrode,
   a semiconductor film provided on the gate insulating film, the semiconductor film including a first region, a second region apart from the first region, and a third region provided between the first region and the second region,
   a first conducting portion electrically connected to the first region and the pixel electrode, and a second conducting portion provided apart from the first conducting portion and electrically connected to the second region.

16. The device according to claim 15, wherein the semiconductor film is an amorphous oxide semiconductor containing at least one of In, Ga, and Zn.

17. The device according to claim 16, wherein a thickness of the semiconductor film is 10 nm or more and 100 nm or less.

18. The device according to claim 15, wherein
the switching element further comprises a channel protection film provided at least on the third region.

* * * * *